US009502086B1

(12) United States Patent
Simon et al.

(10) Patent No.: US 9,502,086 B1
(45) Date of Patent: Nov. 22, 2016

(54) METHOD AND SYSTEM FOR ANALYZING DOUBLE DATA RATE (DDR) RANDOM ACCESS MEMORY (RAM) SIGNALS AND DISPLAYING DDR RAM TRANSACTIONS

(71) Applicant: Keysight Technologies, Inc., Minneapolis, MN (US)

(72) Inventors: Frank D. Simon, Colorado Springs, CO (US); Michael Shaun Backsen, Westcliffe, CO (US)

(73) Assignee: Keysight Technologies, Inc., Santa Rosa, CA (US)

( * ) Notice: Subject to any disclaimer, the term of this patent is extended or adjusted under 35 U.S.C. 154(b) by 0 days.

(21) Appl. No.: 14/949,775

(22) Filed: Nov. 23, 2015

(51) Int. Cl.
| G11C 8/16 | (2006.01) |
| G11C 7/22 | (2006.01) |
| G11C 7/12 | (2006.01) |
| G11C 7/10 | (2006.01) |

(52) U.S. Cl.
CPC ............... *G11C 7/22* (2013.01); *G11C 7/1051* (2013.01); *G11C 7/1072* (2013.01); *G11C 7/1078* (2013.01); *G11C 7/12* (2013.01); *G11C 7/1045* (2013.01)

(58) Field of Classification Search
CPC ..... G11C 7/1072; G11C 7/1078; G11C 7/22; G11C 7/1051; G11C 7/1045
USPC ................. 365/233.13, 233.1, 241
See application file for complete search history.

(56) References Cited

U.S. PATENT DOCUMENTS

| 6,618,320 B2* | 9/2003 | Hasegawa | G11C 7/1051 365/189.05 |
| 6,621,754 B1* | 9/2003 | Chang | G11C 7/1066 365/226 |
| 6,940,768 B2* | 9/2005 | Dahlberg | G11C 7/1078 365/189.15 |
| 8,085,608 B2* | 12/2011 | Cheng | G11C 7/1051 365/191 |

* cited by examiner

*Primary Examiner* — Pho M Luu

(57) ABSTRACT

A logic analyzer and method of logic analysis: detect via one or more probes a plurality of signals associated with a double data rate (DDR) random access memory (RAM); analyze the detected signals to identify a plurality of Transactions for the DDR RAM pertaining to a plurality of Operations for the DDR RAM; select one of the plurality of Operations for the DDR RAM; identify all of the Transactions for the DDR RAM which pertain to the selected Operation; and display indications of all of the Transactions for the DDR RAM which pertain to the selected Operation together on a display window of a display device.

20 Claims, 10 Drawing Sheets

METHOD AND SYSTEM FOR ANALYZING DOUBLE DATA RATE (DDR) RANDOM ACCESS MEMORY (RAM) SIGNALS AND DISPLAYING DDR RAM TRANSACTIONS

BACKGROUND

A logic analyzer is a test and measurement instrument that is extremely useful for troubleshooting digital circuits involving numerous signals. Like an oscilloscope, a logic analyzer captures signals from a Device Under Test (DUT) and displays a representation of those signals on a display screen. Unlike an oscilloscope, which typically has up to four input channels, a logic analyzer may have 32, 64, 128 or more input channels. Oscilloscopes acquire signal data representative of analog characteristics of the signal, such as specific amplitude values, rise times, fall times, etc. A logic analyzer is concerned with logic levels (0 and 1) and timing relationships between the signals.

Meanwhile, double data rate (DDR) random access memories (RAMs) are increasingly employed in a variety of electronics systems and, in particular, in computer systems. FIG. 1 illustrates an example of a memory array 10 of a DDR RAM 5. DDR RAM 5 has a multi-bank architecture with a plurality of memory cells organized in banks 12, rows 14 and columns 16 of bits 11. DDR RAM 5 also includes row buffers 18. A typical DDR RAM 5 may have: four to eight banks 12; 16K rows 14 per bank 12; 1024 columns 16 per row 14; and four to sixteen memory bits 11 per column.

An example execution of a memory access Transaction for DDR RAM 5 will be described with respect to FIG. 2. For a single read or write Transaction, only one bank 12 of the DDR RAM is accessed. As shown in FIG. 3, the requested row 14 is activated and copied to a row buffer 18 of the corresponding bank 12. Then read and/or write bursts are issued to the active row 14. Finally, the row 14 is precharged and the data is stored back into the memory array 10.

A logic analyzer is a useful instrument for debugging DDR RAM devices, analyzing their performance, verifying their compliance with published specifications, etc.

However, data records acquired by a logic analyzer can be very long, for example, tens of megasamples on each channel of the logic analyzer. While the ability to capture such a large amount of data is certainly a desirable feature for a logic analyzer, identifying and organizing specific data within a long data record is often a daunting task for a user. For example, a user may want to view data pertaining to related events on one screen without having to scroll through different sets of data that were captured at different times and/or switching from one display screen to another.

In particular, in the case of a DDR RAM device, a traditional logic analyzer display may show decoded Transactions at various locations in a display window in time-stamp order. This means that interrelated Transactions may be spread out through multiple locations in the display and all of the interrelated Transactions would not necessarily be shown with each other in a single display screen and be separated by several pages in the display. That is, a user typically must scroll through the window to find all of the individual decoded Transactions which are related to each other, and cannot see them all at once, or even easily identify related Transactions. In fact, in a DDR RAM data capture, different Transactions for different ranks and banks of the DDR RAM device which is being analyzed may be interleaved with each other, thus making it even harder for a user to track related Transactions. Furthermore, doing so manually can be a tedious task.

Accordingly, it would be desirable to be able to provide a logic analyzer instrument and method which can display captured DDR RAM data in a manner that may be more easily understood by a user.

SUMMARY

According to one aspect of the invention, a method comprises: detecting via one or more probes a plurality of signals associated with a double data rate (DDR) random access memory (RAM); analyzing the detected signals to identify a plurality of Transactions for the DDR RAM pertaining to a plurality of Operations for the DDR RAM; selecting one of the plurality of Operations for the DDR RAM; identifying all of the Transactions for the DDR RAM which pertain to the selected Operation; and displaying indications of all of the Transactions for the DDR RAM which pertain to the selected Operation together on a display window of a display device.

In some embodiments, the method further comprises: displaying in a second display window indications of the plurality of Transactions for the DDR RAM pertaining to the plurality of Operations for the DDR RAM; and receiving via a user interface a selection of one of the plurality of Transactions for the DDR RAM from the second display window, wherein selecting one of the plurality of Operations for the DDR RAM comprises selecting the one of the plurality of Operations to which the one of the plurality of Transactions for the DDR RAM which is selected via the user interface from the second display window pertains.

In some versions of these embodiments, the method further comprises displaying in a third display window time waveforms corresponding to a plurality of Commands for the DDR RAM pertaining to the plurality of Transactions for the DDR RAM, including the Transaction which is displayed in the second display window and selected via the user interface.

In some versions of these embodiments, the method further comprises, in response to receiving a selection of one of the Transactions for the DDR RAM which pertain to the selected Operation in the display window, automatically adjusting a location in time of the time waveforms displayed in the third display window to a time when the selected Transaction occurred.

In some embodiments, the method further comprises, in response to receiving via a user interface a selection of one of the Transactions for DDR RAM which pertain to the selected Operation in the display window, displaying in a second display window indications of some of the plurality of Transactions for the DDR RAM, and automatically adjusting a location in time displayed in the second display window to a time when the selected Transaction occurred.

In some embodiments, the method further comprises, not displaying in the display window indications of any Transactions for the DDR RAM which do not pertain to the selected Operation.

In some embodiments, the selected Operation comprises one selected from the group consisting of a read Operation and a write Operation.

In some embodiments, the plurality of Transactions for the DDR RAM comprises at least one selected from the group consisting of an activate Transaction, a read Transaction, a write Transaction, and a precharge Transaction.

In some embodiments, the method further comprises displaying the Transactions for the DDR RAM which pertain to the selected Operation in a sequential order of occurrence from a top of the display window to a bottom of the display window, or from a left side of the display window to a right side of the display window.

In some embodiments, the method further comprises displaying in the display window a timestamp for each the displayed Transactions for the DDR RAM which pertain to the selected Operation.

In some embodiments, the method further comprises displaying in the display window a relative timing of all of the displayed Transactions for the DDR RAM which pertain to the selected Operation.

In some embodiments, the method further comprises displaying the indications of all of the Transactions for the DDR RAM which pertain to the selected Operation includes displaying a table including a Transaction ID and a Transaction type for each of the Transactions for the DDR RAM which pertain to the selected Operation.

In some versions of these embodiments, the method further comprises displaying the indications of all of the Transactions for the DDR RAM which pertain to the selected Operation further includes highlighting one of the Transactions for the DDR RAM which pertains to the selected Operation in response to a user selection, and displaying one or more addresses in the DDR RAM associated with the highlighted Transaction, and one or more data values corresponding to the one or more addresses.

According to another aspect of the invention, an instrument comprises: a signal detection device configured to detect via one or more probes a plurality of signals associated with a double data rate (DDR) random access memory (RAM); a processing subsystem configured to: analyze the detected signals to identify a plurality of Transactions for the DDR RAM pertaining to a plurality of Operations for the DDR RAM; select one of the plurality of Operations for the DDR RAM; identify all of the Transactions for the DDR RAM which pertain to the selected Operation; and control a display device to display indications of all of the Transactions for the DDR RAM which pertain to the selected Operation together on a display window of the display device.

In some embodiments, the processing subsystem includes: one or more processing units; memory associated with the one or more processing units, the memory storing therein instructions to be performed by the one or more processing units to cause the processing subsystem to: analyze the detected signals to identify the plurality of Transactions for the DDR RAM pertaining to the plurality of Operations for the DDR RAM; select the one of the plurality of Operations for the DDR RAM; identify all of the Transactions for the DDR RAM which pertain to the selected Operation; and control the display device to display the indications of all of the Transactions for the DDR RAM which pertain to the selected Operation together on the display window of the display device.

In some embodiments, the instrument further comprises a user interface, wherein the processing subsystem is further configured to: control the display device to display in a second display window indications of the plurality of Transactions for the DDR RAM pertaining to the plurality of Operations for the DDR RAM; and receive via the user interface a selection of one of the plurality of Transactions for the DDR RAM pertaining to the plurality of Operations for the DDR RAM which is displayed on the second display window, and wherein the processing subsystem is configured to select the one of the plurality of Operations by selecting the one of the plurality of Operations to which the one of the plurality of Transactions for the DDR RAM which is displayed in the second display window and selected via the user interface pertains.

In some versions of these embodiments, the processing subsystem is further configured to cause the display device to display in a third display window time waveforms corresponding to a plurality of Commands for the DDR RAM pertaining to the plurality of Transactions for the DDR RAM, including the Transaction which is displayed in the second display window and selected via the user interface.

In some versions of these embodiments, the processing subsystem is further configured to automatically adjust, in response to receiving a selection of one of the Transactions for the DDR RAM which pertain to the selected Operation in the display window, a location in time displayed in the third display window to a time when the selected Transaction occurred.

In some embodiments, the processing subsystem is further configured to control the display device, in response to the processing subsystem receiving via a user interface a selection of one of the Transactions for the DDR RAM which pertain to the selected Operation in the display window, to display in a second display window indications of some of the plurality of Transactions for the DDR RAM, and to adjust automatically a location in time displayed in the second display window to a time when the selected Transaction occurred.

In some embodiments, the processing subsystem is further configured to control the display device to not display in the display window indications of any Transactions for the DDR RAM which do not pertain to the selected Operation.

BRIEF DESCRIPTION OF THE DRAWINGS

The example embodiments are best understood from the following detailed description when read with the accompanying drawing figures. In fact, the dimensions may be arbitrarily increased or decreased for clarity of discussion. Wherever applicable and practical, like reference numerals refer to like elements.

DETAILED DESCRIPTION

Figure 1:
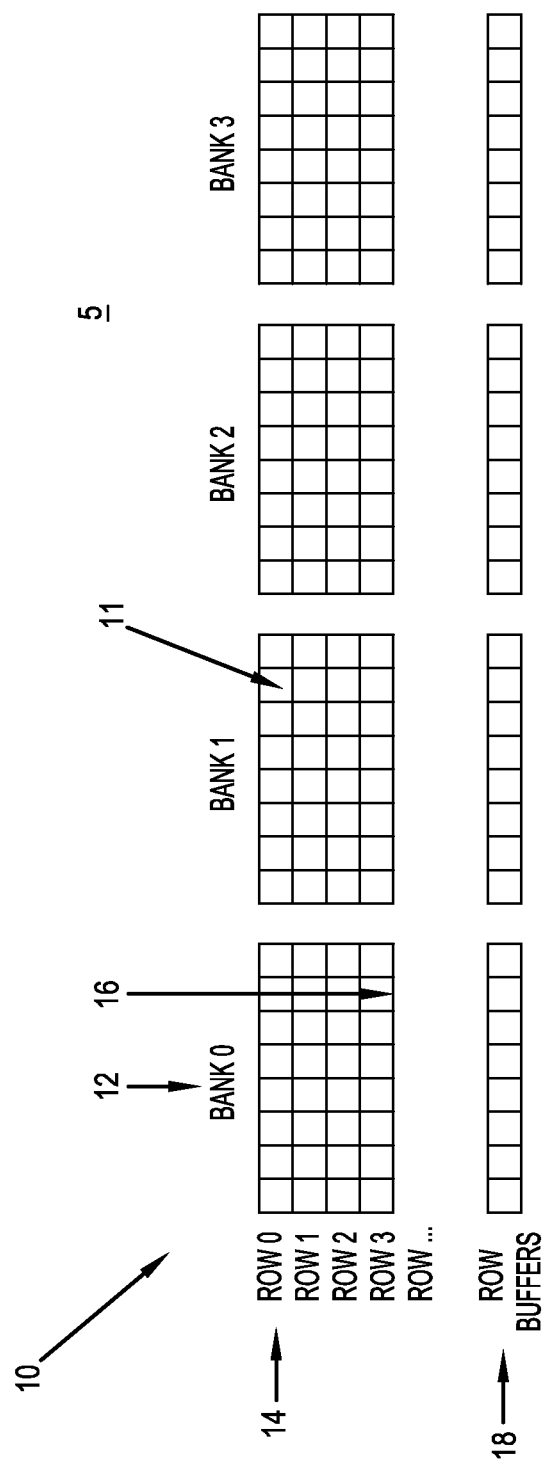
FIG. 1 illustrates a portion of an example of a Double Data Rate (DDR) Random Access Memory (RAM).
Figure 2:
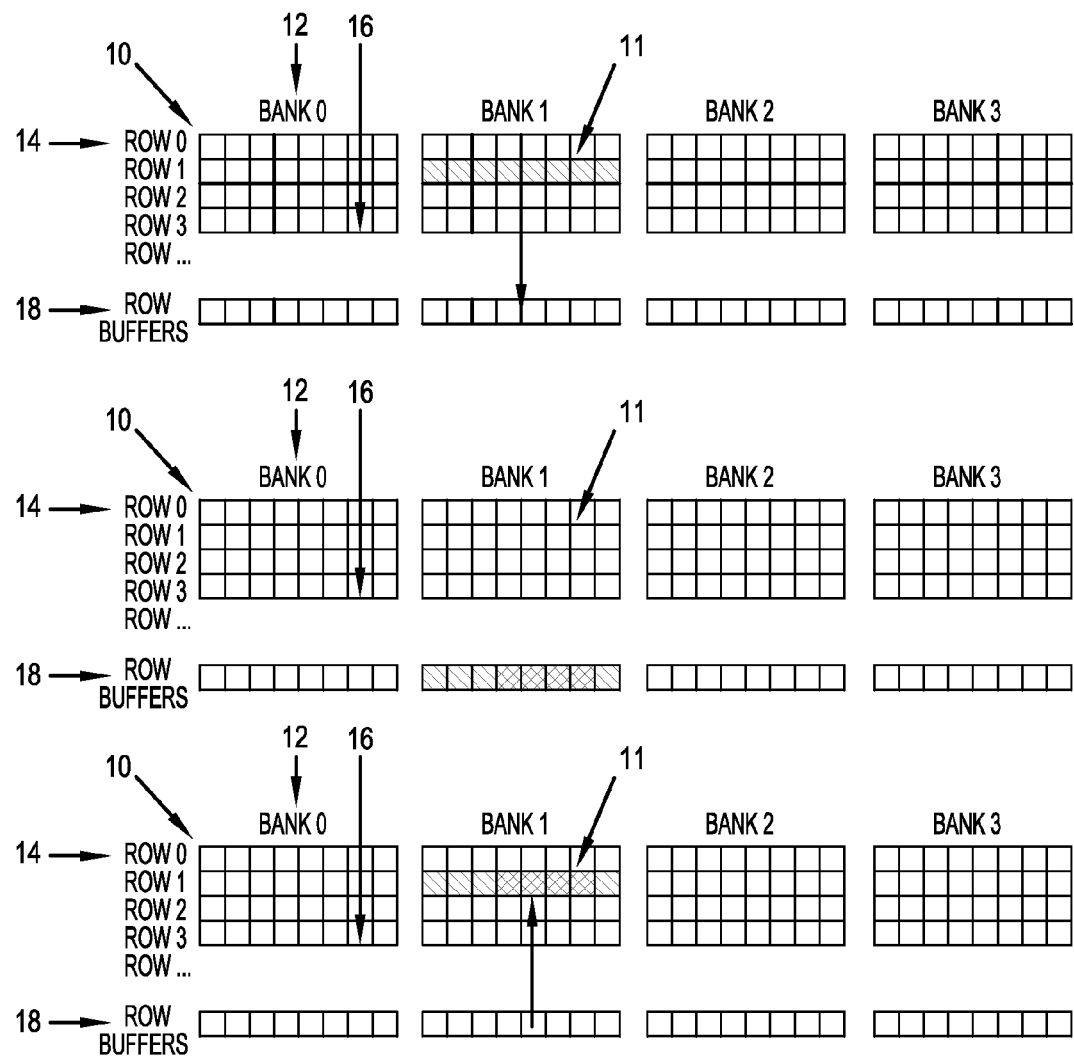
FIG. 2 is a drawing for illustrating an example memory access Transaction for a DDR RAM.

In the following detailed description, for purposes of explanation and not limitation, example embodiments disclosing specific details are set forth in order to provide a thorough understanding of an embodiment according to the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparati and methods may be omitted so as to not obscure the description of the example embodiments. Such methods and apparati are clearly within the scope of the present teachings.

Unless otherwise noted, when a first device is said to be connected to a second device, this encompasses cases where one or more intermediate devices may be employed to connect the two devices to each other. However, when a first device is said to be directly connected to a second device, this encompasses only cases where the two devices are connected to each other without any intermediate or intervening devices. Similarly, when a signal is said to be coupled to a device, this encompasses cases where one or more intermediate devices may be employed to couple the signal to the device. However, when a signal is said to be directly coupled to a device, this encompasses only cases where the signal is directly coupled to the device without any intermediate or intervening devices.

As used herein, a Double Data Rate (DDR) Random Access Memory (RAM) device may be a DDR2 SDRAM, DDR2 SDRAM, DDR3 SDRAM, DDR4 SDRAM device, or any device which is compliant with any of the past, present, or future DDR RAM specifications, including low power DDR RAM specifications such as LPDDR1, LPDDR1E, LPDDR2, LPDDR2E, LPDDR3, LPDDR3E, LPDDR4, and LPDDR4E.

As used herein, a Command means a Command defined in any of the past, present, or future DDR RAM specifications. Each Command is defined by a specific set of states for signals appearing at various pins of the DDR RAM device at different clock edges. For example, TABLE 1 below lists Commands for LPDDR4 and shows the corresponding states for various device pins.

TABLE 1

| First cycle (CS = H) | | | | | | Second cycle (CS = L) | | | | | | Command |
|---|---|---|---|---|---|---|---|---|---|---|---|---|
| CA5 | CA4 | CA3 | CA2 | CA1 | CA0 | CA5 | CA4 | CA3 | CA2 | CA1 | CA0 | |
| L | L | L | L | L | L | — | | | | | | Deselect |
| H | L | L | L | L | L | 0 | OP4 | OP3 | OP2 | OP1 | 1 | Multi-purpose Command |
| AB | H | L | L | L | L | — | | | BA2 | BA1 | BA0 | Precharge (AB = all banks) |
| AB | L | H | L | L | L | — | | | BA2 | BA1 | BA0 | Refresh (AB = All banks) |
| — | H | H | L | L | L | — | | | | | | Self-refresh entry |
| BL | L | L | H | L | L | AP | C9 | — | BA2 | BA1 | BA0 | Write-1 (+CAS-2) |
| — | H | L | H | L | L | — | | | | | | Self-refresh exit |
| 0 | L | H | H | L | L | AP | C9 | — | BA2 | BA1 | BA0 | Masked Write-1 (+CAS-2) |
| — | H | H | H | L | L | — | | | | | | (reserved) |
| BL | L | L | L | H | L | AP | C9 | — | BA2 | BA1 | BA0 | Read-1 (+CAS-2) |
| C8 | H | L | H | H | L | C7 | C6 | C5 | C4 | C3 | C2 | CAS-2 |
| — | | H | L | H | L | — | | | | | | (reserved) |
| OP7 | L | L | H | H | L | MA5 | MA4 | MA3 | MA2 | MA1 | MA0 | Mode Register Write-1 and -2 MA = Address, OP = Data |
| OP6 | H | L | H | H | L | OP5 | OP4 | OP3 | OP2 | OP1 | OP0 | |
| — | L | H | H | H | L | MA5 | MA4 | MA3 | MA2 | MA1 | MA0 | Mode Register Read (+CAS-2) |
| — | H | H | H | H | L | — | | | | | | (reserved) |
| R15 | R14 | R13 | R12 | L | H | R11 | R10 | — | BA2 | BA1 | BA0 | Activate-1 and -2 |
| R9 | R8 | R7 | R6 | H | H | R5 | R4 | R3 | R2 | R1 | R0 | |

A logic analyzer may identify a particular Command when the captured logic analyzer data meets the criteria defined for that Command in Table 1.

As used herein, a Transaction is defined one or more Commands that are performed together according to the various DDR RAM specifications. For example, the LPDDR specification defines a "Read-1" Command. The "-1" indicates that the Read-1 will be followed by another Command called "CAS-2". Taking the information stored in both Read-1 Command and CAS-2 Command and combining them into a single entity creates a "Transaction." In this case, the Read-1 and the CAS-2 are combined to form a Read Transaction. Similarly, a Write-1 Command and CAS-2 Command are combined to form a Write Transaction. Other DDR specifications such as DDR3 do not have multi-part Transactions. So in a sense, DDR3 Commands have a 1-1 correspondence to DDR3 Transactions.

Across the various DDR specifications, Transactions include: "Device deselected" (DES); "Multi Purpose Command" (MPC), "Mode Register Set" (MRS), "Mode Register Read" (MRR), "Mode Register Write" (MRW), "Refresh" (REF), "Self Refresh Entry" (SRE), "Self Refresh Exit" (SRX), "Precharge" (PRE), "Activate" (ACT), "Write" (WR), "Mask Write" (MWR), "Read" (RD), "Power Down Entry" (PDE), "Power Down Exit" (PDX), "ZQ Calibration" (ZQC), "CAS" (CAS), "NOP" (NOP), "Deep Power Down Entry" (DPDE), "Deep Power Down Exit" (DPDX), "Exit PD, SREF or DPD" (EXIT), "Clock Change" (CC).

As used herein, an Operation means a collection of Transactions which pertain to a same rank and a same row (same address) of a DDR RAM device under test, and which begin with an Activate Transaction and end with a Precharge Transaction. Here we say that such Transaction pertain to, or belong to, the Operation. Operations include a Write Operation and a Read Operation.

As noted above, DDR RAM devices are employed in a variety of electronic systems, and there is often a need to analyze signals associated with a DDR RAM device for debugging the device, analyzing its performance, verifying its compliance with published specifications, etc.

Figure 3:
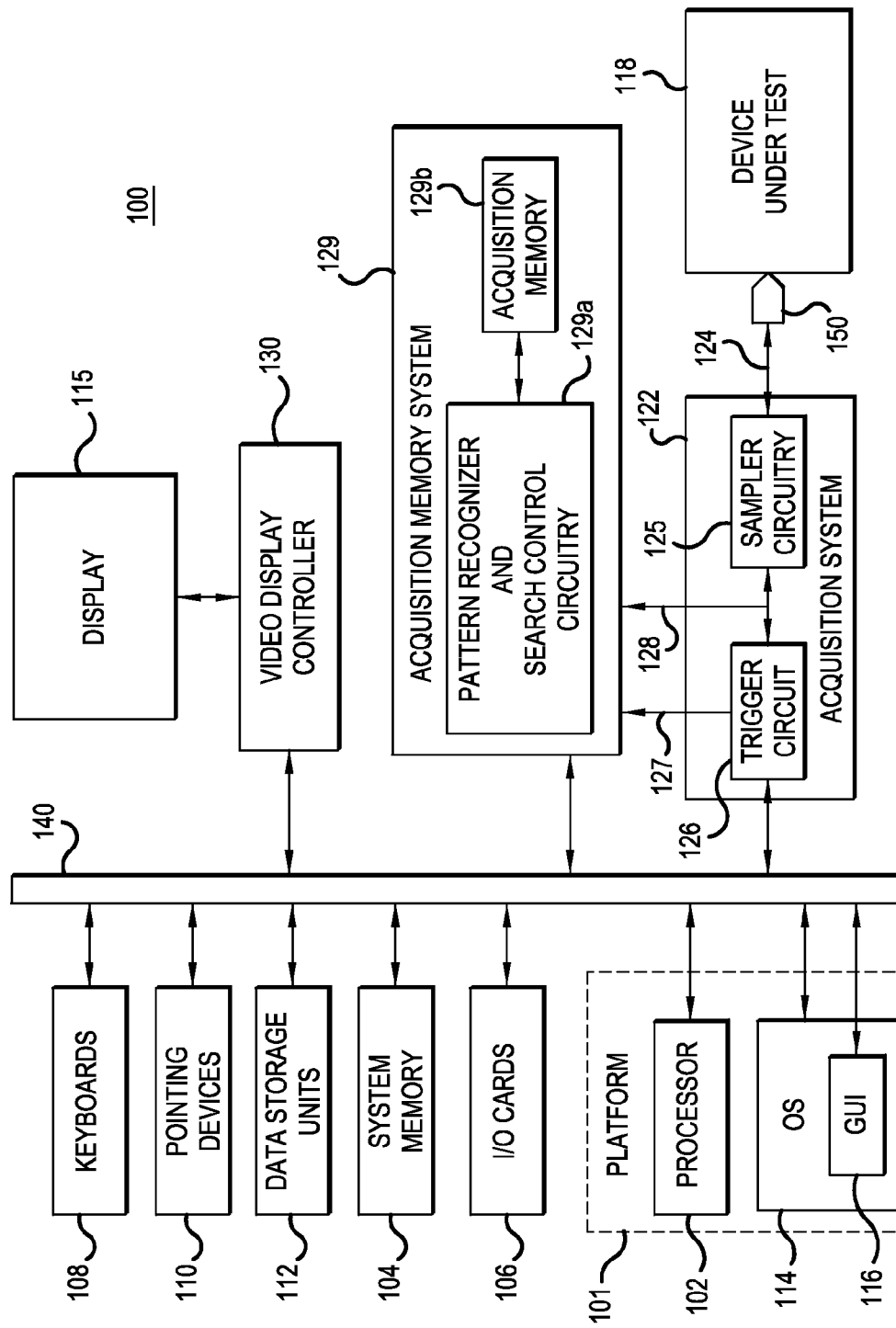
FIG. 3 shows, in block diagram form, an example embodiment of a logic analyzer 100 which may be employed to analyze Operations of a DDR RAM device, for example for debugging, performance analysis, or verifying its compliance with published specifications.

FIG. 3 shows, in block diagram form, an example embodiment of a logic analyzer 100 which may be employed to analyze Operations of a Double Data Rate (DDR) Random Access Memory (RAM) device, for example for debugging, performance analysis, or verifying its compliance with published specifications, according to one or more aspects of the present invention as described below. It should be understood that other logic analyzers whose configuration is different than that of logic analyzer 100 may also employ one or more aspects of the present invention to debug, analyze, or verify performance specifications of DDR RAM devices. Thus logic analyzer 100 is shown only to provide one concrete and non-limiting example embodiment.

Logic analyzer 100 includes a general purpose computing platform 101, which may be programmable using any one of a variety of high level or low level programming languages and further may include specially programmed, special-purpose hardware, software and/or firmware capable of performing signal acquisition, processing and/or display functions.

Logic analyzer 100 includes processor 102, system memory 104, input/output (I/O) cards 106, and data storage units 112, such as a hard disk drive, FLASH memory, etc. Logic analyzer 100 may also include one or more user input/output devices, such as keyboard 108, pointing device (e.g., mouse, trackball, etc.) 110 and display device 115 for supporting a graphical user interface (GUI) 116. System memory 104 comprises Random Access Memory (RAM) and is typically used for storage of program instructions and/or data, which may include programs which cause logic analyzer 100 to perform functions and methods described below (for example, with respect to FIG. 4), and to display data in various display windows as described below (for example, with respect to FIGS. 6-10). Display device 115 may include a cathode ray display, plasma, liquid crystal display (LCD), and/or other type of display, and may be logically and/or physically divided into an array of picture elements or pixels. In some embodiments, display device 115 may comprise a touchscreen for receiving user inputs, as is known in the art. Input/output (I/O) cards 106 may include modem cards, network interface cards, graphics cards, audio cards and/or other types of I/O cards.

Processor 102 may be any one of a number of commercially available processors, including general purpose microprocessors from companies such as INTEL® and ADVANCED MICRO DEVICES®. Processor 102 executes instructions of its associated operating system 114 (which may be stored in system memory 104), and implements and controls graphical user interface (GUI) 116 for facilitating various data processing operations for ultimate display on display device 115. Processor 102 and operating system 114, may generally define a computing platform shown by dashed block 101, for which application programs in high level programming languages may be written. As illustrated in FIG. 3, communication among various components takes place via system bus 140.

Signals are acquired from a Device Under Test (DUT) 118, for example a DDR RAM, by Acquisition System 122 operating under control of processor 102, via one or more probes 150. Acquisition System 122 includes hardware, firmware, and software, necessary to acquire data samples at appropriate times. Acquisition system 122 receives logic signals from system under test 118 via probes 150 and data channels 124. The logic signals are acquired by acquisition system 122 by sampling the signals to determine their logic level. That is, a sampler 125 of acquisition system 122 can be thought of as a one-bit per channel analog-to-digital (A/D) converter, which determines whether each of the signal samples exhibits a logic level high, or a logic level low state. The sampled and digitized representation of signals 128 are continually stored in acquisition memory 129b of an Acquisition Memory System 129 until a trigger event is detected by a trigger circuit 126, which causes generation of a trigger signal 127. At that point, in response to trigger signal 127, the writing of data to acquisition memory 129b is stopped and the acquired data in acquisition memory 129b is transferred elsewhere within logic analyzer 100 for further processing. Logic analyzer 100 may also include video display controller 130 for controlling the display on display device 115, video display controller 130 being under control of computing platform 101 using standard WINDOWS® applications program interfaces (APIs). Acquisition Memory System 129 also includes a Pattern Recognition and Search Control Circuitry portion 129a, which may be employed in Operations described below.

As mentioned above, in a DDR RAM data capture different Transactions for different ranks and banks of the DDR RAM device which is being analyzed may be shown on a display interleaved with each other, thus making it difficult for a user to track related Transactions. Thus, methods and systems described below provide a logic analyzer (e.g., logic analyzer 100) and method which display on a display device in a display window all of related Transactions which pertain to a selected Operation, organized together, and beneficially without showing other unrelated Transactions which do not pertain to the selected Operation.

Figure 4:
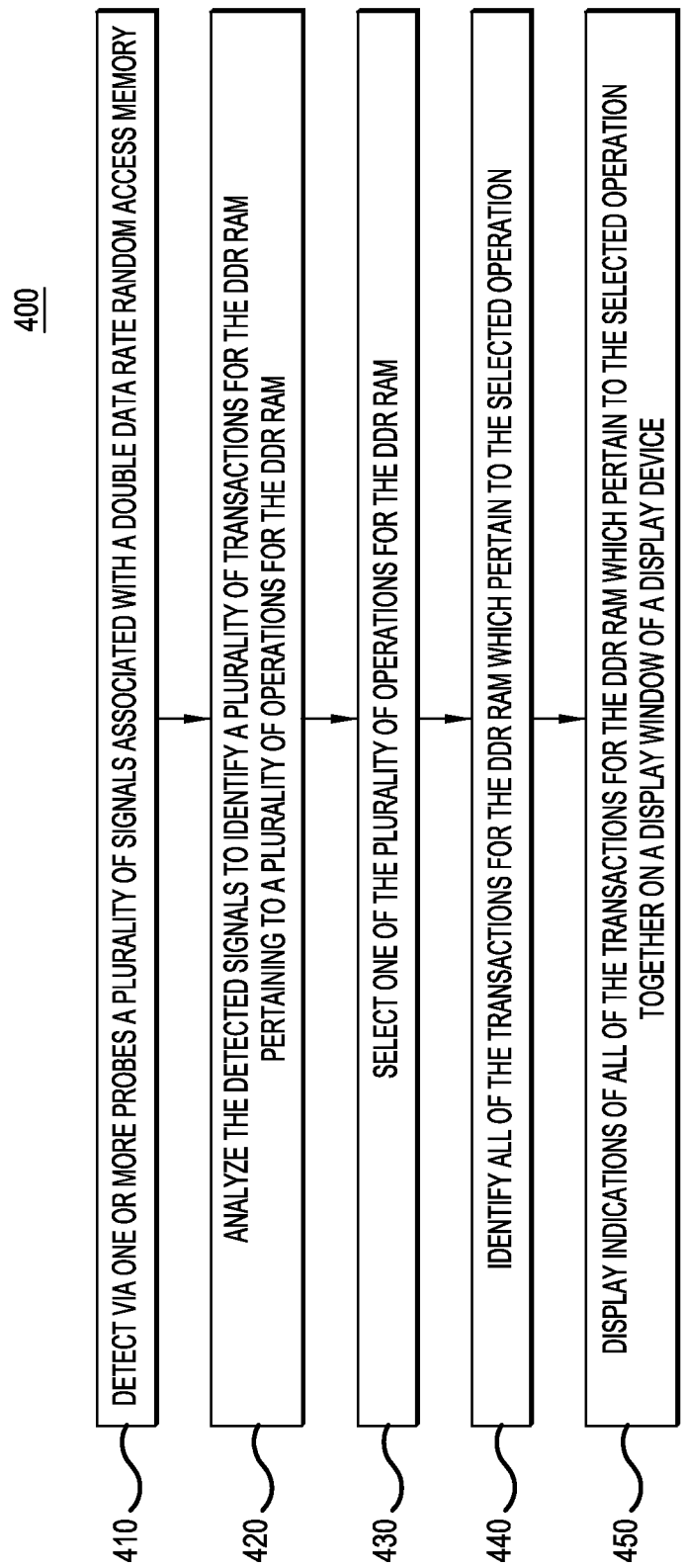
FIG. 4 illustrates an example embodiment of a method of displaying logic analysis data for a DDR RAM on a display device.

FIG. 4 illustrates an example embodiment of a method 400 of displaying logic analysis data for a DDR RAM device under test (e.g., DUT 118) on a display device, for example display device 115 of logic analyzer 100. Indeed, in some embodiments, method 400 may be performed by logic analyzer 100. In the description below, we describe various operations of method 400. Here the term "operation" of method 400 is used in a general sense, and should not be confused with an Operation of a DDR RAM as specifically defined above.

An operation 410 of method 400 includes detecting via one or more probes (e.g., probes 150) a plurality of signals associated with a double data rate (DDR) random access memory (RAM) device under test.

An operation 420 of method 400 includes analyzing the detected signals to identify a plurality of Transactions for the DDR RAM device under test which pertain to a plurality of Operations for the DDR RAM device under test. In some embodiments, this analysis may be performed by processor 102 of logic analyzer 100 in conjunction with acquisition system 122 and acquisition memory system 129. In some cases, the Transactions for the DDR RAM device under test may include one or more of: an activate Transaction, a read Transaction, a write Transaction, or a precharge Transaction.

An operation 430 of method 400 includes selecting one of the plurality of Operations for the DDR RAM device under test whose Transactions are identified in Operation 420. For example, as described below, a plurality of Transactions for the DDR RAM pertaining to a plurality of Operations for the DDR RAM device under test may be displayed by the logic analyzer (e.g., logic analyzer 100) in a display window (e.g., a "Transactions Window," an example of which is described below) of display device 115 via GUI 116. In that case, the selected Operation may be selected by a user highlighting or selecting one of the Transactions which appears in the display window and which pertains to the selected Operation by means of a pointing device 110 or keyboard 108, or where display device 115 is a touchscreen device by touching the area of the display window where the Transaction is displayed.

An operation 440 of method 400 includes identifying all of the Transactions for the DDR RAM device under test which pertain to the Operation for the DDR RAM device under test which was selected in operation 430. As noted above, an Operation for the DDR RAM device under test means a collection of Transactions which pertain to a same rank and a same row (same address) of the DDR RAM device under test, and which begin with an Activate Transaction and end with a Precharge Transaction. Operations for the DDR RAM for the DDR RAM device under test include a Write Operation and a Read Operation.

An operation 450 of method 400 includes displaying indications of all of the Transactions for the DDR RAM which pertain to the selected Operation together in a single display window (e.g., a "an Operation Window", an example of which is described below) of the display device (e.g., display device 115). Here, we say that the display window displays "indications of all of the Transactions: in recognition that a Transaction is something that is performed by the DDR RAM device which cannot technically be seen, and displaying the word "Activate" is displays a representation of an Activate transaction, but technically does not display the actual Activate transaction itself. In the simplest case, a representation of a Transaction can be merely displayed text of the name of the Transaction in any convenient language, such as "Activate," "Read," "Precharge," etc. Of course other representations or indicia might be employed in addition to or instead of the textual representation, including predefined symbols, numbers, icons, colors, etc.

Beneficially, the display window does not display indications of any Transactions for the DDR RAM device under test which do not pertain to the selected Operation. Beneficially, this includes displaying the Transactions for the DDR RAM device under test which pertain to the selected Operation in a sequential order of occurrence from the top of the display window to the bottom of the display window, or from the left side of the display window to the right side of the display window.

In some embodiments, operation 450 of method 400 includes displaying in the display window a timestamp for each the displayed Transactions for the DDR RAM device under test which pertain to the selected Operation.

In some embodiments, operation 450 of method 400 includes displaying in the display window a relative timing of all of the displayed Transactions for the DDR RAM device under test which pertain to the selected Operation.

In some embodiments, operation 450 of method 400 includes displaying the indications of all of the Transactions for the DDR RAM which pertain to the selected Operation in a table, including a Transaction ID and a Transaction type for each of the Transactions.

In some embodiments, operation 450 of method 400 includes highlighting the indication of one of the Transactions for the DDR RAM which pertains to the selected Operation in response to a user selection, and displaying one or more addresses in the DDR RAM associated with the highlighted Transaction, and one or more data values corresponding to the one or more addresses.

Further details of example embodiments of a system which may perform method 400 will be described below.

Figure 5:
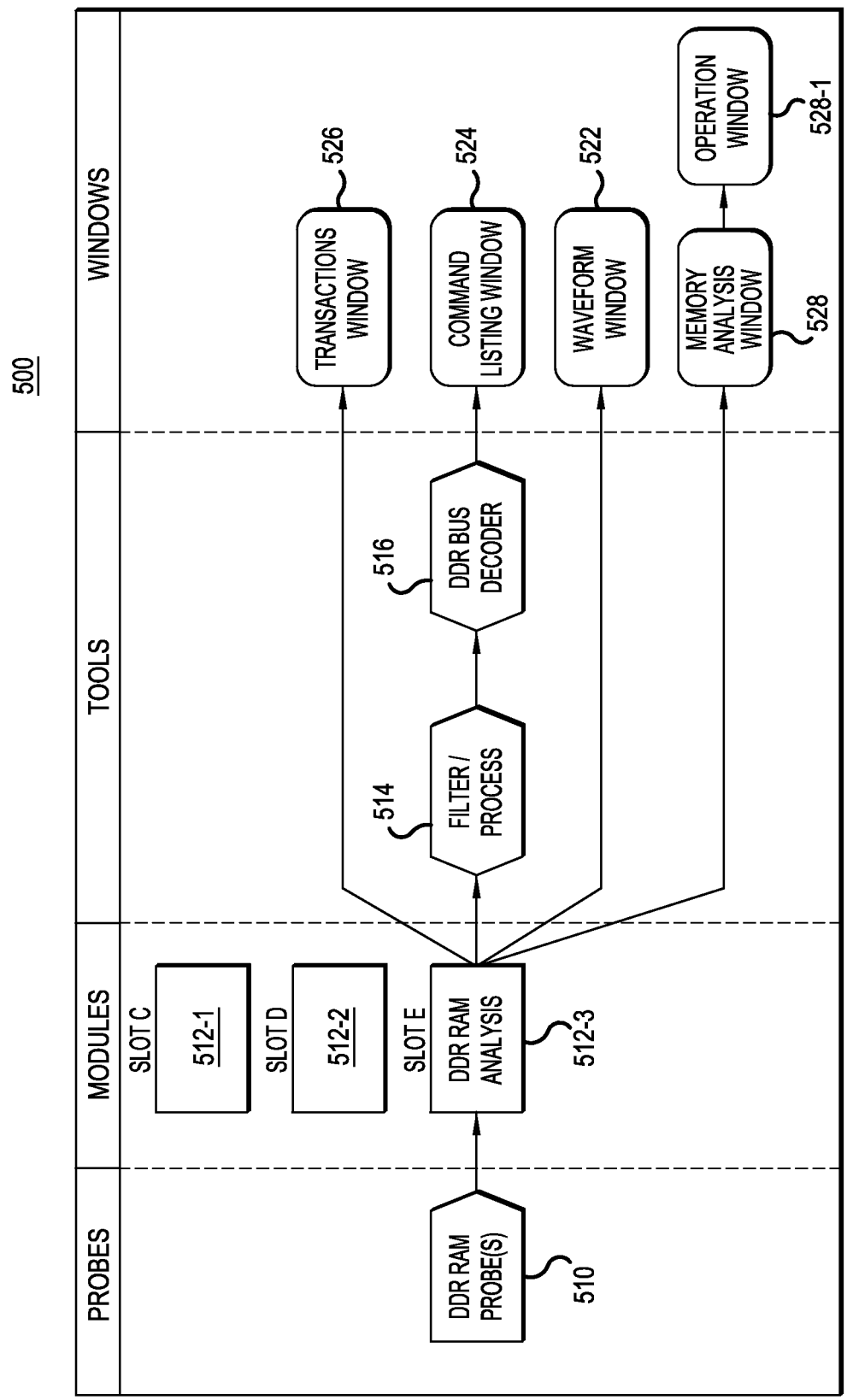
FIG. 5 is a functional diagram illustrating signal processing components of an example embodiment of a logic analyzer.

FIG. 5 is a conceptual diagram illustrating signal processing components of an example embodiment of a logic analyzer 500 which may perform method 400. Here, the logic analyzer 500 includes one or more DDR RAM probes 510, and a plurality of modules 512-2, 512-2, 512-3, etc, the hardware for each of which may be provided in corresponding slots (Slot C, Slot D, Slot E) of a rack for housing logic analyzer 500. Here, module 512-3 is identified as a DDR RAM Analysis module, and it invokes certain tools and windows to perform its operations. Tools include a filter/processing tool 514 for processing data received from DDR RAM Probe(s) 510, and a DDR Bus Decoder tool 516 for making logical sense of the processed data in the context of a DDR RAM device. As described in greater detail below, the windows may be displayed on a display device (e.g., display device 115) and may include a Waveform Window 522, a Command Listing Window 524, a Transaction Window 526, and a Memory Analysis Window 528, which may include an Operation Window 528-1. In various embodiments, display device 115 may display two, or more, or all, of the windows 522, 524, 526, 528, and 528-1 at the same time on display device 115 as part of a graphical user interface (e.g., GUI 116). Windows 522, 524, 526, 528, and 528-1 may be resized, moved, dragged, broken off of tabs, open, closed, etc. by a user making appropriate actions with keyboard 108, pointing device (e.g., mouse) 110, touchscreen, etc., as is well known in the art.

Figure 6:
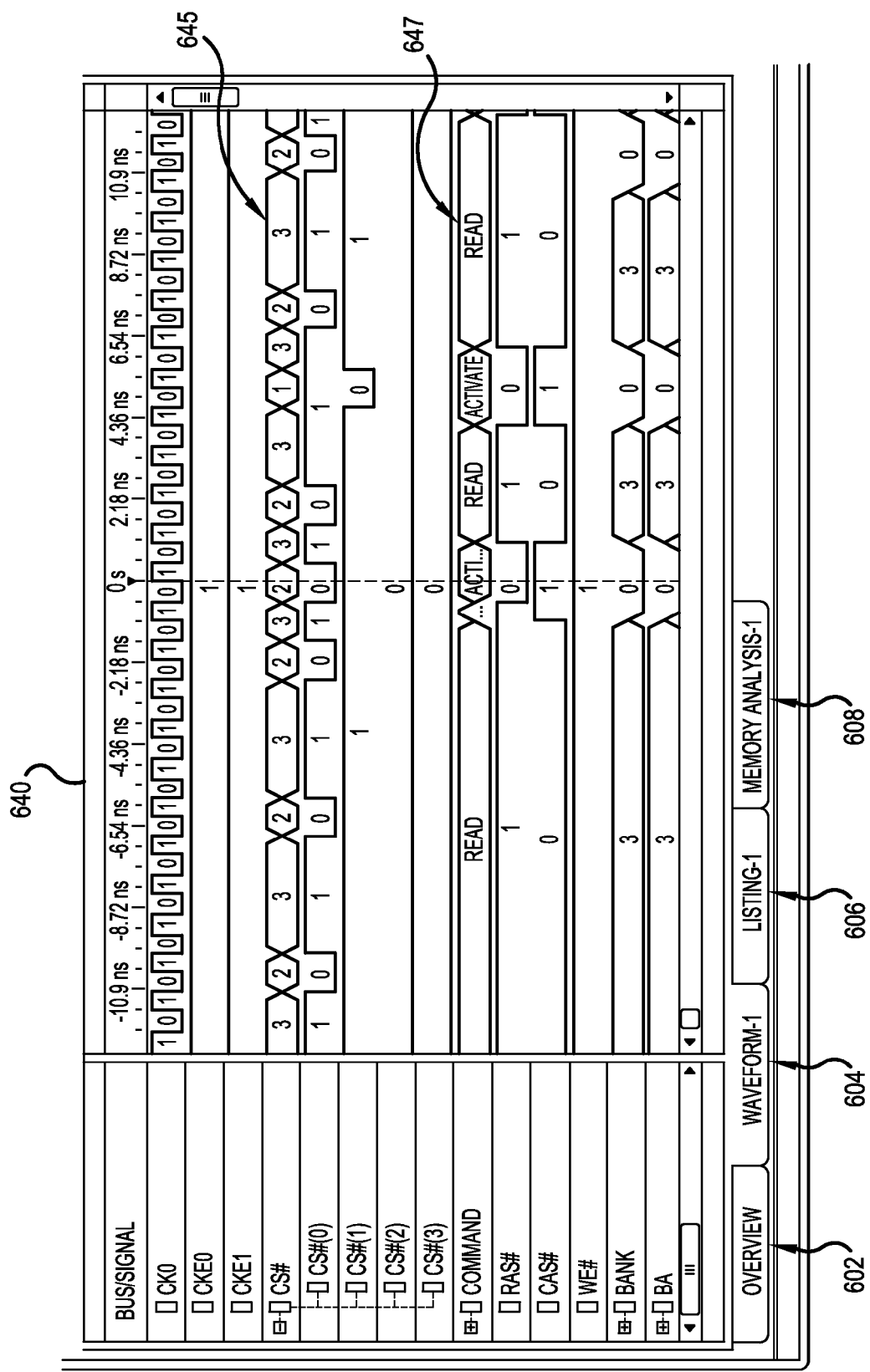
FIG. 6 illustrates an example embodiment of a display window displaying logic waveforms of a DDR RAM.

FIG. 6 illustrates an example embodiment of a Waveform Window 640. Waveform Window 640 may be one embodiment of Waveform Window 522 of FIG. 5, and may be displayed on display device 115 by logic analyzer 100. In this embodiment, Waveform Window 640 is a "tabbed window" which is selected among a group of other tabbed windows by a user selecting the corresponding tab 604 among a plurality of tabs 602, 604, 606 and 608 via the GUI (e.g., GUI 116) and a pointing device (e.g., mouse) 110, keyboard 108, touchscreen, etc. Here, selection of tab 602 presents or displays an Overview Window, selection of tab 606 presents or displays a Command Listing Window (e.g., Command Listing Window 524 of FIG. 5), and selection of tab 608 presents or displays a Memory Analysis window (e.g., Memory Analysis Window 528 of FIG. 5). In other embodiments Waveform Window 640 may not be a tabbed window.

Waveform Window 640 displays one of more waveforms 645 of data captured by the logic analyzer. Beneficially, Waveform Window 640 may also display indications 647 of one of more Commands represented by displayed waveforms 645. Also beneficially, Waveform Window 640 may display indications of an address and/or data for each of the indicated Commands 647 for the displayed waveforms 645.

Figure 7:
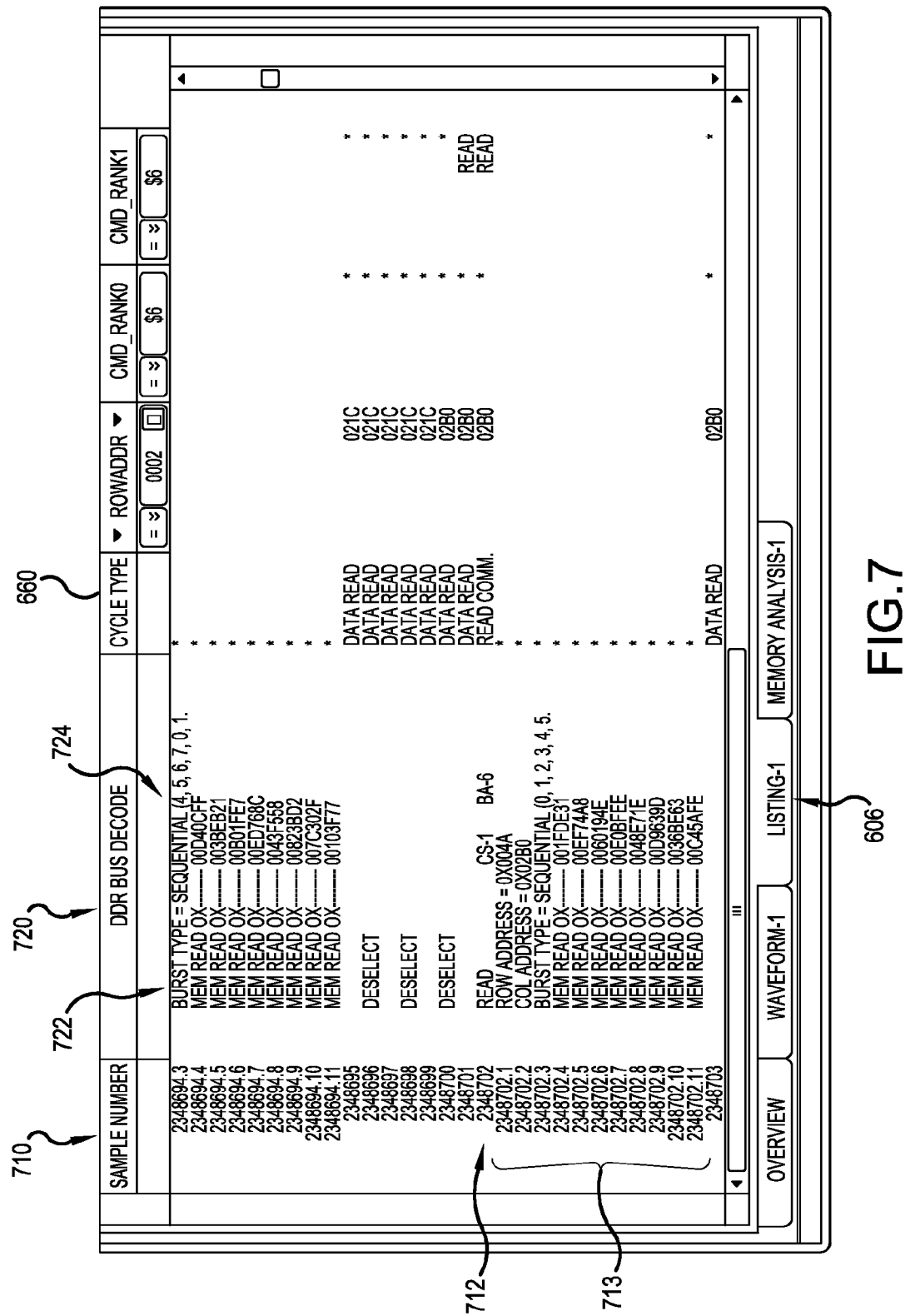
FIG. 7 illustrates an example embodiment of a display window displaying a listing of Commands for a DDR RAM.

FIG. 7 illustrates an example embodiment of a Command Listing Window 660. Command Listing Window 660 may be one embodiment of Command Listing Window 524 of FIG. 5, and may be displayed on display device 115 by logic analyzer 100 in response to a user selecting tab 606 via GUI 116 and a pointing device (e.g., mouse) 110, keyboard 108, touchscreen, etc. Command Listing Window 660 displays a sequential listing of Command 712 and corresponding data sample numbers 710, and DDR Bus Decode data 720. As an example, FIG. 7 shows a representation 712 of a data sample 2348702 for a Read Command, which has associated therewith representations 713 of a plurality of data samples (e.g., 2348702.1 through 2348702.11) associated with the Read Command. DDR Bus Decode data 720 includes data descriptors 722 (e.g., "Read," "Deselect," "Row Address,") and associated data values 724, which may represent an address in the DDR RAM device under test, or data written to or read from an address in the DDR RAM device under test.

Figure 8:
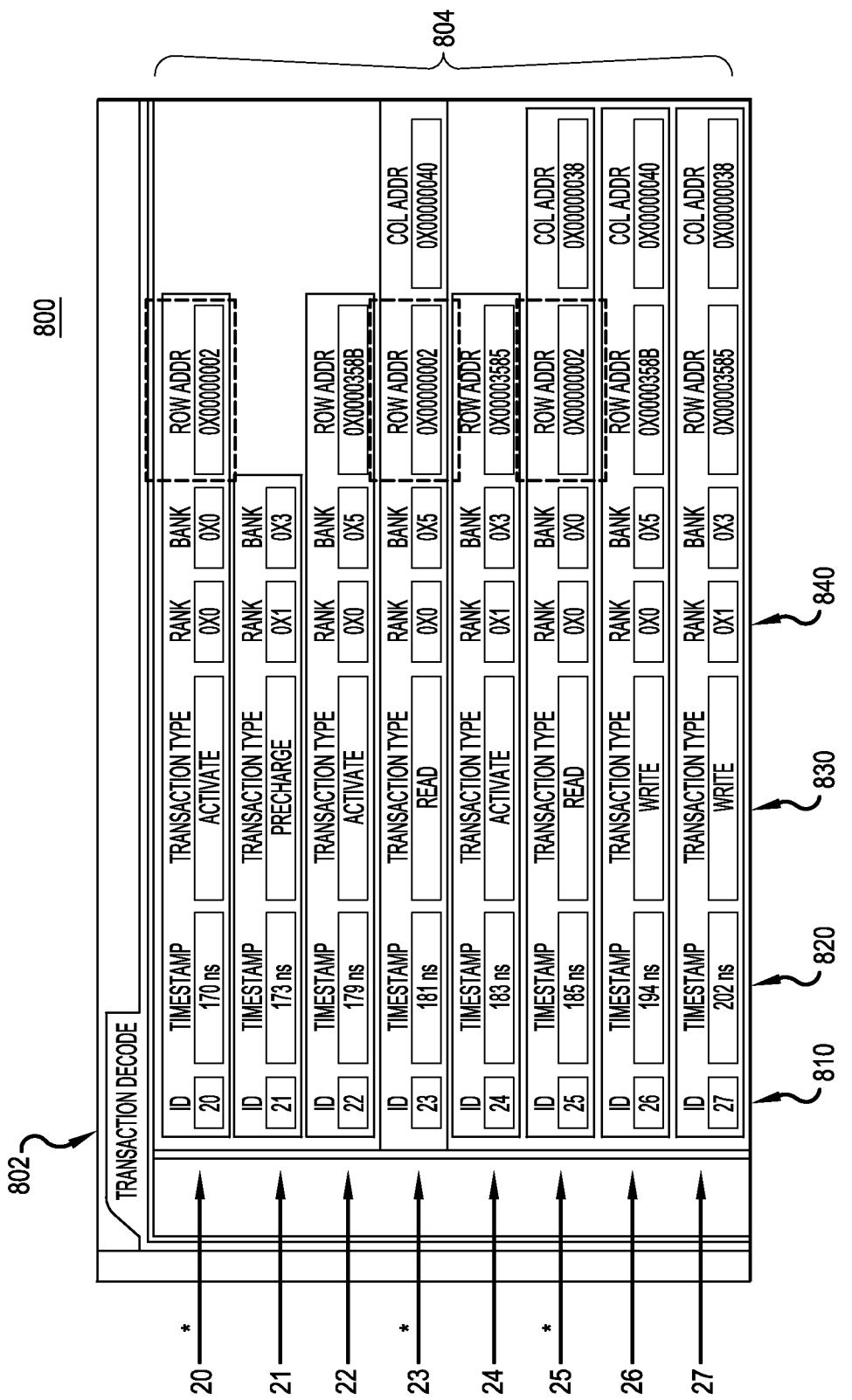
FIG. 8 illustrates an example embodiment of a display window displaying a listing of Transactions for a DDR RAM.

FIG. 8 illustrates an example embodiment of a Transactions Window 800. Transactions Window 800 may be one embodiment of Transactions Window 526 of FIG. 5, and may be displayed on display device 115 by logic analyzer 100 in response to a user selecting a Transactions Decode tab 802 via GUI 116 and a pointing device (e.g., mouse) 110, keyboard 108, touchscreen, etc. Transactions Window 800 displays a listing 804 of representations 20, 21, 22, 23, 24, 25, 26 and 27 of Transactions having corresponding Transaction IDs 20 through 27, which are displayed in a Transaction ID field 810 of Transactions Window 800. Transactions Window 800 also displays a timestamp 820, a transaction type (e.g., "Activate," "Precharge," "Read," "Write," etc.) 830, an address 840, including a Rank, a Bank, a Row Address and a Column Address as appropriate, for each Transaction represented in listing 804.

In general, the Transactions which are represented in the listing 804 pertain to a plurality of different Operations of the DDR RAM device under test. However, some of the Transactions pertain to the same Operation as each other. Here, it is seen that the Transactions with Transaction IDs 20, 23 and 28 (which have the same Rank and Row Address) pertain to, or belong to, the same Operation as each other, possibly along with other Transactions which are not displayed by display device 115 in Transactions Window 800 (but which in some cases might be found by scrolling down Transactions Window 800).

As noted above, it would be beneficial for a user to be able to see all of the interrelated Transactions which belong to the same Operation at the same time in one display window.

Figure 9:
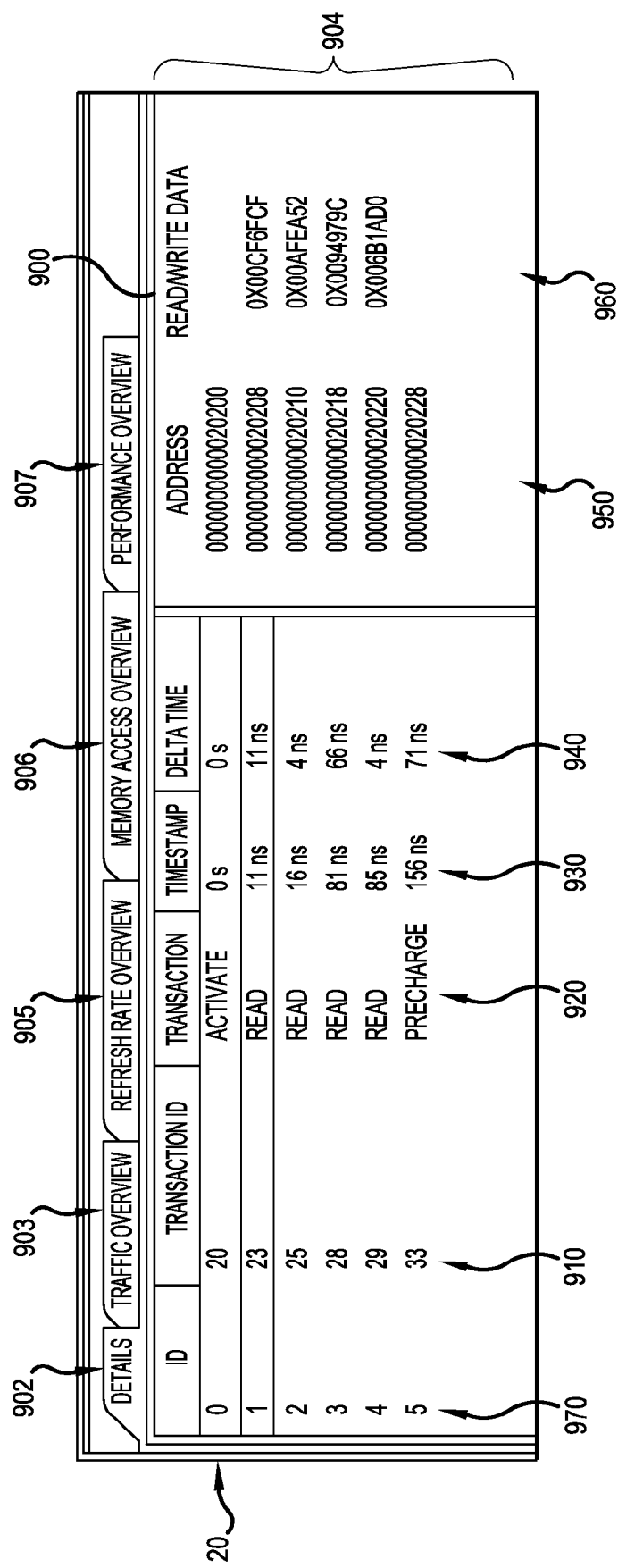
FIG. 9 illustrates an example embodiment of a display window displaying a listing of Transactions pertaining to a selected Operation for a DDR RAM.

Toward this end, FIG. 9 illustrates an example embodiment of an Operation Window 900 which displays indications of all of the Transactions for the DDR RAM which pertain to the selected Operation together in one place. Operation Window 900 displays a table or listing 904 of representations of Transactions having corresponding Transaction IDs 20, 23, 25, 28, 29 and 33 which are displayed in a Transaction ID field 910 of Operation Window 900. Operation Window 900 also displays a transaction type (e.g., "Activate," "Precharge," "Read," "Write," etc.) 920, a "running" timestamp 930 indicating a time from the beginning of the Operation when the Transaction occurred, and a "Delta Time" field indicating a relative time with respect to when a previous Transaction occurred. For a Transaction whose representation is selected or highlighted in listing 904 (e.g., Transaction ID 23), Operation Window 900 also displays an address 950, and a representation of the data 960 which is read from or written to the corresponding address 950, for each Transaction represented in listing 804. Beneficially, this information may be the same information that is shown for the Command listing window 660. Operation Window 900 also displays an ID number 970 for each Transaction, which represents its order in the sequence of Transactions for the selected Operation.

In this embodiment, Operation Window 900 is a "tabbed window" which is selected among a group of other tabbed windows by a user selecting the corresponding tab 902 among a plurality of tabs 902, 903, 905, 906 and 907 via the GUI (e.g., GUI 116) and a pointing device (e.g., mouse) 110, keyboard 108, touchscreen, etc. Here, selection of tab 902 presents or displays Operation Window 900, selection of tab 903 presents or displays a Traffic Overview Window, selection of tab 905 presents or displays a Refresh Rate Overview Window, selection of tab 906 presents or displays a Memory Access Overview Window, and selection of tab 907 presents or displays a Performance Overview Window. Each of these windows may display data which corresponds to the names assigned to them. In other embodiments Operation Window 900 may not be a tabbed window.

Beneficially, Operation Window 900 does not display indications of any Transactions for the DDR RAM device under test which do not pertain to the selected Operation. Beneficially, Operation Window 900 lists the Transactions for the DDR RAM device under test which pertain to the selected Operation in listing 904 in a sequential order of occurrence from the top of the Operation Window 900 to the bottom of the Operation Window 900. Of course in other embodiments, listing 904 may be arranged in columns rather than rows, and in that case Operation Window 900 may list the Transactions for the DDR RAM device under test which pertain to the selected Operation in listing 904 in a sequential order of occurrence from the left of Operation Window 900 to the right of Operation Window 900.

In operation, a user may highlight or select one of the Transaction representations in Transactions Window 800, and Operation Window 900 may be dynamically/automatically updated to show representations of all of the Transactions for the Operation to which the highlighted or selected Transaction pertains or belongs. For example, as shown in FIG. 8, a user has highlighted Transaction ID 23, which represents a Read transaction, and in response thereto Operation Window 900 is dynamically/automatically updated to show representations of all of the Transactions (Transaction IDs 20, 23, 25, 28, 29 and 33) which pertain to the same Operation as Transaction ID 23, in sequential order.

A user can select a Transaction ID in listing 904 of Operation Window 900 via a pointing device (e.g., mouse) 110, touchscreen, keyboard 108 (e.g., up/down arrows), etc., and in response thereto the Transactions Window 800 may dynamically/automatically update to show the selected Transaction ID and information for other Transactions around the point in time when the Transaction with the selected Transaction ID occurred.

In some embodiments, the Logic Analyzer may include a "lockstep" feature which, when activated or turned on, causes all time-correlated display windows, such as Waveform Window 640, the Traffic Overview Window, the Refresh Rate Overview Window, the Memory Access Overview Window, the Performance Overview Window, etc. to be dynamically/automatically updated to display data for the time of the selected Transaction.

Figure 10:
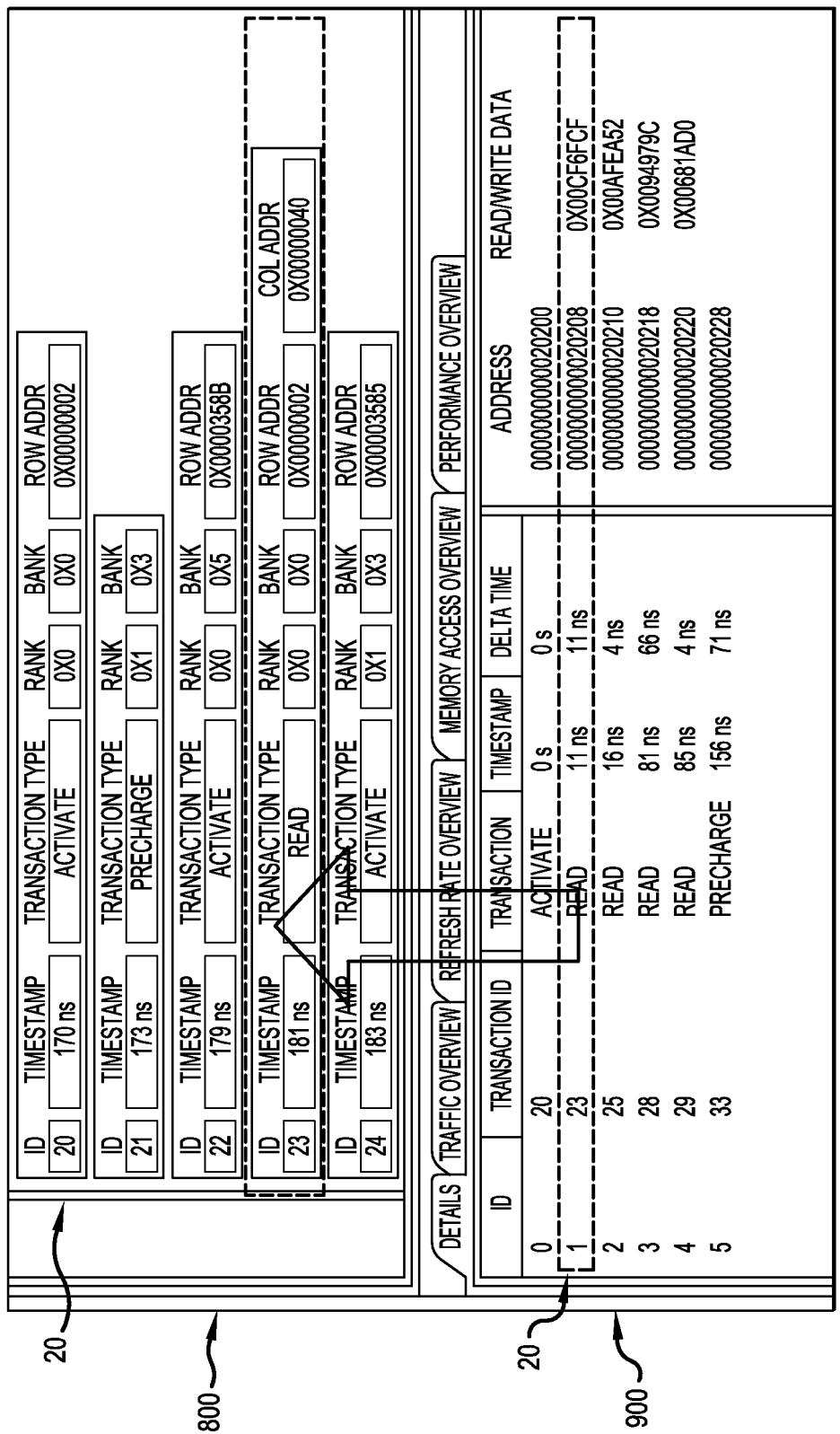
FIG. 10 illustrates a process of navigating between a display window displaying a listing of Transactions pertaining to a selected Operation for a DDR RAM and a display window displaying a listing of Transactions for a DDR RAM.

For example, FIG. 10 illustrates a process of navigating between Operation Window 900 and Transactions Window 800. Here, a user has selected the Transaction having Transaction ID 20 in Transactions listing 904 of Operation Window 900, and in response thereto Transactions Window 800 is dynamically/automatically updated to "scroll" to the location of the Transaction having Transaction ID 20.

The method 400 and windows 640, 660, 800, 900 and associated operations described above may be provided by logic analyzer 100 or another suitable logic analyzer.

In general, an instrument (e.g., logic analyzer 100) may include: a signal detection device (e.g., acquisition system 122) configured to detect via one or more probes (e.g., probe(s) 150) a plurality of signals associated with a double data rate (DDR) random access memory (RAM) (e.g., DUT 118); and a processing subsystem (e.g., computing platform 101 and system memory 104). The processing subsystem may be configured to: analyze the detected signals to identify a plurality of Transactions for the DDR RAM pertaining to a plurality of Operations for the DDR RAM; select one of the plurality of Operations for the DDR RAM; identify all of the Transactions for the DDR RAM which pertain to the selected Operation; and control a display device (e.g., display device 115) to display indications of all of the Transactions for the DDR RAM which pertain to the selected Operation together on a display window (e.g., Operation Window 900) of the display device.

The processing subsystem may include one or more processing units (e.g., processor 102); and memory (e.g., system memory 104) associated with the one or more processing units. The memory stores therein instructions to be performed by the one or more processing units to cause the processing subsystem to: analyze the detected signals to identify the plurality of Transactions for the DDR RAM pertaining to the plurality of Operations for the DDR RAM; select the one of the plurality of Operations for the DDR RAM; identify all of the Transactions for the DDR RAM which pertain to the selected Operation; and control the display device to display the indications of all of the Transactions for the DDR RAM which pertain to the selected Operation together on the display window of the display device.

The instrument of claim may include a user interface (e.g., GUI 116). The processing subsystem may be further configured to: control the display device to display in a second display window (e.g., Transactions Window 800) indications of the plurality of Transactions for the DDR RAM pertaining to the plurality of Operations for the DDR RAM; and receive via the user interface a selection of one of the plurality of Transactions from the second display window. The processing subsystem may be configured to select the one of the plurality of Operations by selecting the Operation to which the selected Transaction pertains.

The processing subsystem may be further configured to cause the display device to display in a third display window (e.g., Waveform Window 640) time waveforms (e.g., waveforms 645) corresponding to a plurality of Commands for the DDR RAM pertaining to the plurality of Transactions for the DDR RAM, including the Transaction which selected via the user interface from the second display window (e.g., Transactions Window 800).

The processing subsystem may be further configured to automatically adjust, in response to receiving a selection of one of the Transactions for the DDR RAM from the display window (e.g., Operations Window 900), a location in time displayed in the third display (e.g., Waveform Window 640) window to a time when the selected Transaction occurred.

The processing subsystem may be further configured to control the display device, in response to the processing subsystem receiving via a user interface a selection of one of the Transactions from the display window (e.g., Operations Window 900), to display in the second display window (e.g., Transactions Window 800) indications of some of the plurality of Transactions for the DDR RAM, and to adjust automatically a location in time displayed in the second display window to a time when the selected Transaction occurred.

The processing subsystem may be further configured to control the display device to not display in the display window (e.g., Operations Window 900) indications of any Transactions for the DDR RAM which do not pertain to the selected Operation.

While example embodiments are disclosed herein, one of ordinary skill in the art appreciates that many variations that are in accordance with the present teachings are possible and remain within the scope of the appended claims. The invention therefore is not to be restricted except within the scope of the appended claims.

The invention claimed is:

1. A method, comprising:
    detecting via one or more probes a plurality of signals associated with a double data rate (DDR) random access memory (RAM);
    analyzing the detected signals to identify a plurality of Transactions for the DDR RAM pertaining to a plurality of Operations for the DDR RAM;
    selecting one of the plurality of Operations for the DDR RAM;
    identifying all of the Transactions for the DDR RAM which pertain to the selected Operation; and
    displaying indications of all of the Transactions for the DDR RAM which pertain to the selected Operation together on a display window of a display device.

2. The method of claim 1, further comprising:
    displaying in a second display window indications of the plurality of Transactions for the DDR RAM pertaining to the plurality of Operations for the DDR RAM; and
    receiving via a user interface a selection of one of the plurality of Transactions for the DDR RAM from the second display window,
    wherein selecting one of the plurality of Operations for the DDR RAM comprises selecting the one of the plurality of Operations to which the one of the plurality of Transactions for the DDR RAM which is selected via the user interface from the second display window pertains.

3. The method of claim 2, further comprising displaying in a third display window time waveforms corresponding to a plurality of Commands for the DDR RAM pertaining to the plurality of Transactions for the DDR RAM, including the Transaction which is selected via the user interface from the second display window.

4. The method of claim 3, further comprising in response to receiving a selection of one of the Transactions for the DDR RAM which pertain to the selected Operation in the display window, automatically adjusting a location in time of the time waveforms displayed in the third display window to a time when the selected Transaction occurred.

5. The method of claim 1, further comprising in response to receiving via a user interface a selection of one of the Transactions for DDR RAM which pertain to the selected Operation in the display window, displaying in a second display window indications of some of the plurality of Transactions for the DDR RAM, and automatically adjusting a location in time displayed in the second display window to a time when the selected Transaction occurred.

6. The method of claim 1, further comprising not displaying in the display window indications of any Transactions for the DDR RAM which do not pertain to the selected Operation.

7. The method of claim 1, wherein the selected Operation comprises one selected from the group consisting of a read Operation and a write Operation.

8. The method of claim 1, wherein the plurality of Transactions for the DDR RAM comprises at least one selected from the group consisting of an activate Transaction, a read Transaction, a write Transaction, and a precharge Transaction.

9. The method of claim 1, further comprising displaying the indications of the Transactions for the DDR RAM which pertain to the selected Operation in a sequential order of occurrence from a top of the display window to a bottom of the display window, or from a left side of the display window to a right side of the display window.

10. The method of claim 1, further comprising displaying in the display window a timestamp for each the Transactions for the DDR RAM which pertain to the selected Operation.

11. The method of claim 1, further comprising displaying in the display window a relative timing of all of the Transactions for the DDR RAM which pertain to the selected Operation.

12. The method of claim 1, wherein displaying the indications of all of the Transactions for the DDR RAM which pertain to the selected Operation includes displaying a table including a Transaction ID and a Transaction type for each of the Transactions for the DDR RAM which pertain to the selected Operation.

13. The method of claim 12, wherein displaying the indications of all of the Transactions for the DDR RAM which pertain to the selected Operation further includes highlighting an indication of one of the Transactions for the DDR RAM which pertains to the selected Operation in response to a user selection, and displaying one or more addresses in the DDR RAM associated with the highlighted Transaction, and one or more data values corresponding to the one or more addresses.

14. An instrument, comprising:
a signal detection device configured to detect via one or more probes a plurality of signals associated with a double data rate (DDR) random access memory (RAM);
a processing subsystem configured to:
analyze the detected signals to identify a plurality of Transactions for the DDR RAM pertaining to a plurality of Operations for the DDR RAM;
select one of the plurality of Operations for the DDR RAM;
identify all of the Transactions for the DDR RAM which pertain to the selected Operation; and
control a display device to display indications of all of the Transactions for the DDR RAM which pertain to the selected Operation together on a display window of the display device.

15. The instrument of claim 14, wherein the processing subsystem includes:
one or more processing units;
memory associated with the one or more processing units, the memory storing therein instructions to be performed by the one or more processing units to cause the processing subsystem to:
analyze the detected signals to identify the plurality of Transactions for the DDR RAM pertaining to the plurality of Operations for the DDR RAM;
select the one of the plurality of Operations for the DDR RAM;
identify all of the Transactions for the DDR RAM which pertain to the selected Operation; and
control the display device to display the indications of all of the Transactions for the DDR RAM which pertain to the selected Operation together on the display window of the display device.

16. The instrument of claim 14, further comprising a user interface,
wherein the processing subsystem is further configured to:
control the display device to display in a second display window indications of the plurality of Transactions for the DDR RAM pertaining to the plurality of Operations for the DDR RAM; and
receive via the user interface a selection of one of the plurality of Transactions for the DDR RAM pertaining to the plurality of Operations for the DDR RAM from the second display window, and
wherein the processing subsystem is configured to select the one of the plurality of Operations by selecting the one of the plurality of Operations to which the one of the plurality of Transactions for the DDR RAM which is selected via the user interface from the second display window pertains.

17. The instrument of claim 16, wherein the processing subsystem is further configured to cause the display device to display in a third display window time waveforms corresponding to a plurality of Commands for the DDR RAM pertaining to the plurality of Transactions for the DDR RAM, including the Transaction which is selected via the user interface from the second display window.

18. The instrument of claim 17, wherein the processing subsystem is further configured to automatically adjust, in response to receiving a selection of one of the Transactions for the DDR RAM which pertain to the selected Operation in the display window, a location in time displayed in the third display window to a time when the selected Transaction occurred.

19. The instrument of claim 14, wherein the processing subsystem is further configured to control the display device, in response to the processing subsystem receiving via a user interface a selection of one of the Transactions for the DDR RAM which pertain to the selected Operation in the display window, to display in a second display window indications of some of the plurality of Transactions for the DDR RAM, and to adjust automatically a location in time displayed in the second display window to a time when the selected Transaction occurred.

20. The instrument of claim 14, wherein the processing subsystem is further configured to control the display device to not display in the display window indications of any Transactions for the DDR RAM which do not pertain to the selected Operation.

* * * * *